United States Patent
Heegard et al.

[11] Patent Number: 6,160,854
[45] Date of Patent: *Dec. 12, 2000

[54] CONCATENATED TRELLIS CODED MODULATION AND LINEAR BLOCK CODES

[75] Inventors: Chris Heegard, Ithaca, N.Y.; David J. Rowe, Madison, Wis.

[73] Assignee: Cornell Research Foundation, Inc., Ithaca, N.Y.

[ * ] Notice: This patent is subject to a terminal disclaimer.

[21] Appl. No.: 09/003,591

[22] Filed: Jan. 6, 1998

Related U.S. Application Data

[63] Continuation of application No. 08/697,837, Aug. 30, 1996, Pat. No. 5,790,570.

[51] Int. Cl.⁷ ................................................ H04L 23/02
[52] U.S. Cl. ........................ 375/265; 375/341; 714/792
[58] Field of Search ................................... 375/265, 341; 714/792

[56] References Cited

U.S. PATENT DOCUMENTS

| | | |
|---|---|---|
| 5,258,987 | 11/1993 | Wei . |
| 5,321,725 | 6/1994 | Paik et al. .............................. 375/265 |
| 5,329,551 | 7/1994 | Wei . |
| 5,416,801 | 5/1995 | Chouly et al. ......................... 375/260 |
| 5,473,621 | 12/1995 | Wei . |
| 5,548,615 | 8/1996 | Wei ........................................ 375/281 |
| 5,621,761 | 4/1997 | Heegard ................................. 375/265 |
| 5,790,570 | 8/1998 | Heegard et al. ....................... 714/755 |

*Primary Examiner*—Don N. Vo
*Attorney, Agent, or Firm*—Jones, Tullar & Cooper PC

[57] ABSTRACT

A concatenated trellis coded modulation and linear block (e.g., Reed-Solomon) encoding scheme splits data to be encoded into two data streams, one of which is both linear block encoded and trellis encoded, and the other of which either remains uncoded or is encoded with a weaker strength linear block code. The coding scheme requires the use of a special decoder which decodes the trellis encoded data first, and then uses the resulting information to decode the non-trellis encoded information. In embodiments using linear block coding for the non-trellis encoded data stream, the relative strengths of the two linear block encoders are selected to balance the resulting code, thereby maximizing coding gain and efficiency.

19 Claims, 5 Drawing Sheets

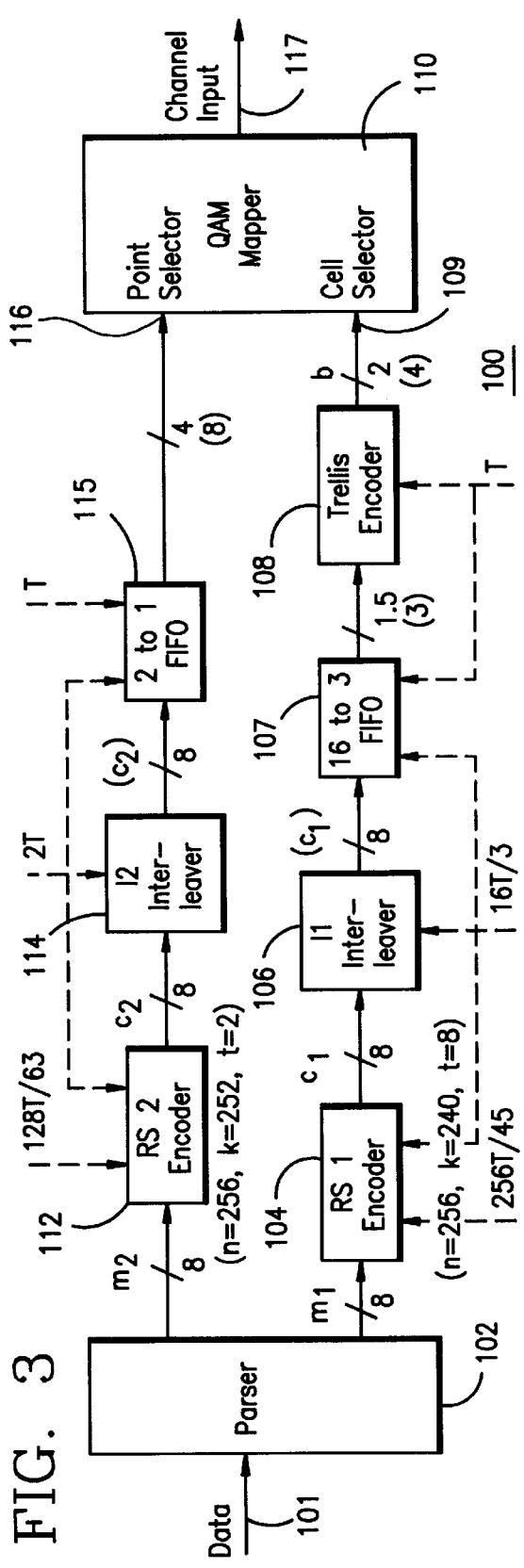
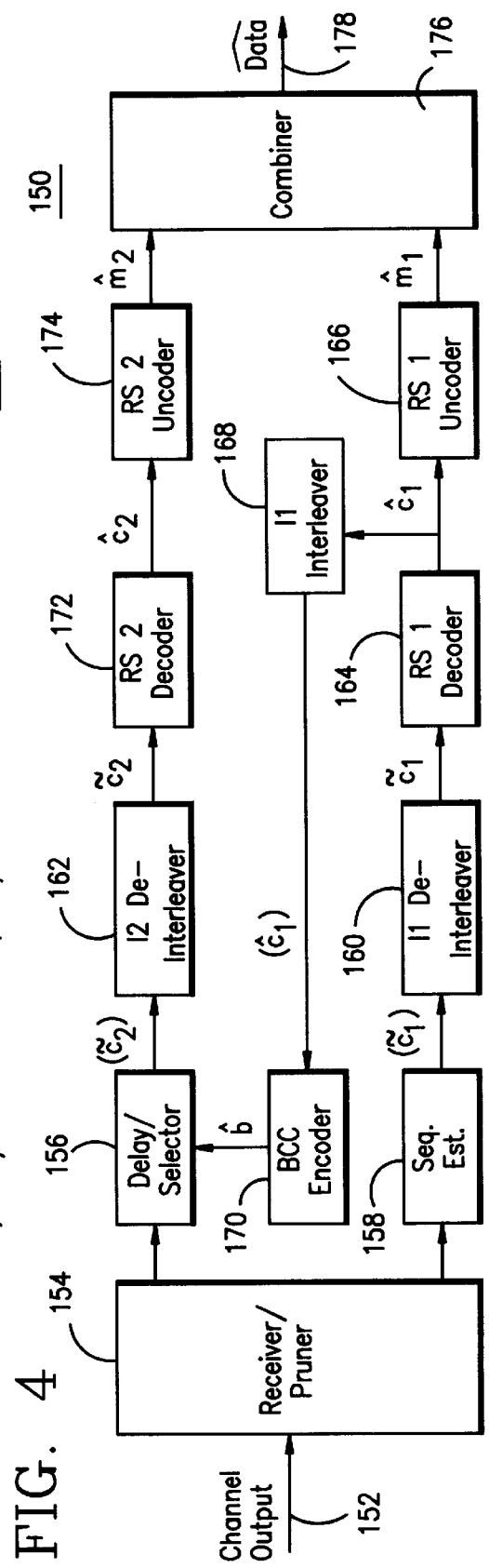
FIG. 3
FIG. 4

CONCATENATED TRELLIS CODED MODULATION AND LINEAR BLOCK CODES

CROSS REFERENCE TO RELATED APPLICATIONS

This application is a continuation of application Ser. No. 08/697,837, filed Aug. 30, 1996 which is now U.S. Pat. No. 5,790,570.

BACKGROUND OF THE INVENTION

The present invention relates in general to a digital coding method and apparatus employing concatenated trellis coded modulation and linear block codes.

Trellis coded modulation (TCM), sometimes known as convolutional coding, is widely used in many digital communication applications, including deep-space, digital satellite transmission, high speed telephone modems and networks, broadcast networks and recording systems. Linear block codes are well known codes which allow single or multiple error correction.

It is known to employ multiple coding schemes simultaneously to provide desired levels of error rate performance, otherwise known as "coding gain". For example, U.S. Pat. No. 5,258,987 to Wei, issued Nov. 2, 1993, discloses a multilevel coding scheme which uses both TCM and a particular linear block code known as a Reed-Solomon (RS) code. In that scheme, a first portion of the input data stream is trellis encoded, and the resulting encoded stream is used to identify, for each of a succession of symbol intervals, a particular one of a predetermined number of subsets of symbols of a predetermined constellation. The remaining, non-trellis encoded input data is encoded using an RS code whose output is used to select for transmission, a particular symbol from the identified subset.

The coding scheme disclosed in the Wei patent allegedly provides a number of advantages. For example, the patent asserts that the bandwidth efficiency can be made to approach that of a system in which the non-trellis encoded bits are not coded at all; errors due to impulse noise of any magnitude can be corrected; the transmission of data at various different bit rates is easily accommodated; and the multilevel coded symbols selected for transmission can be interleaved in order to provide enhanced immunity to channel input pulse noise and/or correlated noise. However, because Wei's coding scheme only applies the RS code to the non-trellis encoded bits, it cannot significantly improve the code's performance with respect to additive white Gaussian noise.

Other multilevel coding schemes have been proposed which address the additive white Gaussian noise problem. However, these coding schemes tend to impose too high a penalty in coding efficiency and bit rate for the increased noise performance. For example, one known multilevel coding scheme encodes a data stream with an RS encoder, and then divides the stream into two substreams, one of which is trellis encoded as in the scheme disclosed in the Wei patent. These schemes tend to be inefficient, however, because the RS encoding is applied to all bits of the data stream equally, including those which are not to be trellis encoded. For the most part, the non-trellis encoded bits require relatively little encoding, or do not require additional encoding at all. As a result, the bit rate of this coding scheme is unnecessarily reduced.

SUMMARY OF THE INVENTION

The present invention addresses the foregoing problems by providing an improved multilevel digital encoding scheme which combines TCM and linear block codes, such as Reed-Solomon codes. In particular, a method is provided for concatenating TCM with linear block coding in which the reliability of the trellis encoded information (the trellis encoded bits) is improved by being linear block encoded, thereby decreasing the code's sensitivity to additive while Gaussian noise. To eliminate the inefficiency which would occur if the entire data stream were linear block encoded, the linear block encoding is only applied to the portion of the data stream to be trellis encoded. Alternatively, a second linear block encoder can be employed for encoding the non-trellis encoded bits of the data stream, however, its error correcting capability is selected to be lower than that of the first linear block encoder. This improves coding efficiency, but not at the expense of coding gain which is determined almost solely by the trellis encoded bits. Using the two linear block encoders, a balancing of the concatenated coding scheme can be achieved through optimal selection of the error control power for each of the linear block codes.

The foregoing coding scheme therefore provides a higher coding gain than typical concatenation methods, however, this is achieved at a cost of increased latency and memory requirements. In particular, the coding scheme requires use of a unique decoder arrangement for properly recovering the original data stream from the trellis and linear block encoded data stream. The decoder incorporates means whereby the reliability of the trellis encoded data is insured before it is used to decode the non-trellis encoded data, also known as the parallel edge information. This is achieved by estimating what the first linear block encoded data stream was, re-trellis encoding this estimated data stream, and using the resultant re-encoded data stream to determine the identity of the parallel edge information. To minimize the corruption of the parallel edge information obtained in this manner, the trellis encoders in both the encoder circuit and in the decoder circuit are both feedback free to limit the propagation of errors in selecting the parallel edge information due to the subsequent re-encoding of the estimated linear block encoded stream. Since this arrangement minimizes the corruption of the parallel edge information, a weaker linear block code, or no code at all, may be employed for encoding the parallel edge information, thereby substantially increasing overall efficiency of the coding scheme.

BRIEF DESCRIPTION OF THE DRAWINGS

The features and advantages of the present invention will become apparent from the following detailed description of a number of preferred embodiments thereof, taken in conjunction with the accompanying drawings in which:

FIG. 3 is a schematic block diagram of an encoder circuit constructed in accordance with the second preferred embodiment of the present invention;

FIG. 4 is a schematic block diagram of a decoder circuit for use with the encoder circuit of FIG. 3;

DETAILED DESCRIPTION OF THE PREFERRED EMBODIMENTS

Although the method and apparatus of the present invention are substantially different in operation and design from the multilevel coding scheme disclosed in U.S. Pat. No. 5,258,987 to Wei, many of the elements employed in the method and apparatus are similar to those used in the Wei scheme. Accordingly, the Wei patent is hereby incorporated by reference.

Figure 1:
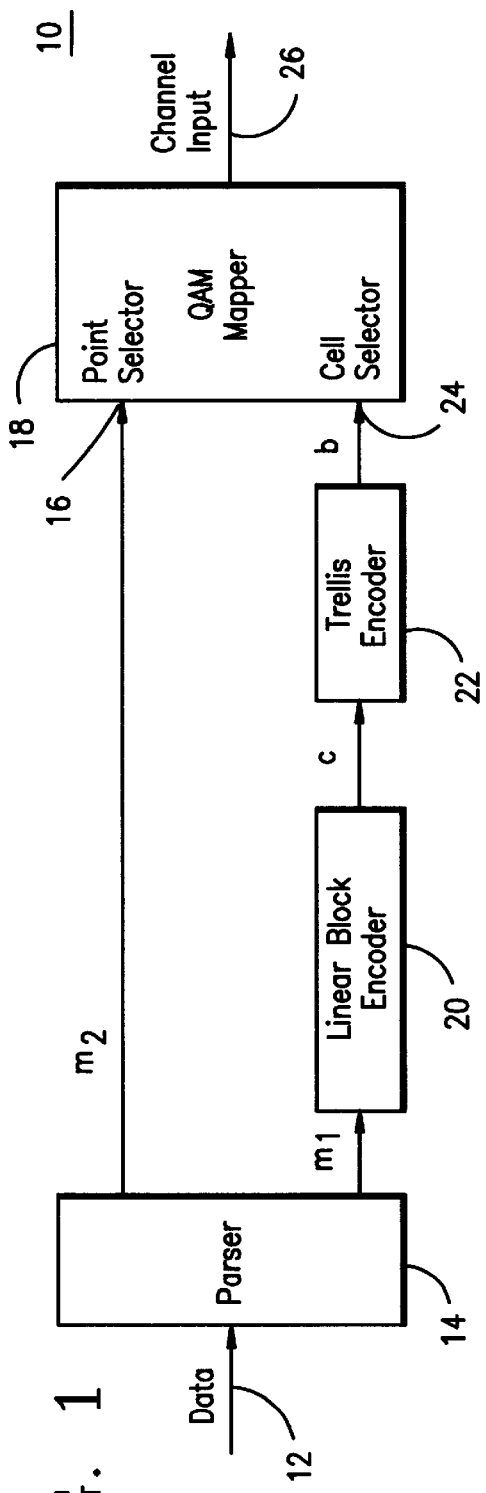
FIG. 1 is a schematic block diagram of an encoder circuit constructed in accordance with the first preferred embodiment of the present invention.

An encoder circuit 10 for encoding an incoming digital data stream 12 in accordance with a first preferred embodiment of the present invention which embodies the invention in its broadest sense, is illustrated in FIG. 1. The incoming data stream 12 is fed into a parser 14 which separates it into a trellis data stream $m_1$, and a non-trellis data stream $m_2$. The non-trellis data stream $m_2$ is fed unaltered into a point selector input 16 of a conventional QAM constellation mapper 18, which may be of the type disclosed in the Wei patent, for example. The $m_2$ data stream, known as the parallel edge information, is employed to designate a multiple bit label for each point of each cell in the QAM map (to be discussed in greater detail in conjunction with FIG. 6). These bits correspond to the most significant bits of the resulting code words, and are the least sensitive to errors. Thus, it is not typically necessary to encode the parallel edge information, or if encoding is employed, it can be of relatively weak strength.

The trellis data stream ml is so named because it is the data stream which will ultimately be trellis encoded. However, to increase the additive white Gaussian noise performance of the code, $m_1$ is first fed to a linear block encoder 20. The linear block encoder 20 can use any conventional linear block code to encode $m_1$, but preferably is a Reed-Solomon (RS) encoder. The linear block encoder 20 generates a linear block encoded data stream $C_1$, which is next encoded by any suitable trellis encoder 22, such as a binary convolutional encoder (BCC). The trellis encoder 22 generates a concatenated TCM/linear block encoded data stream b, which is input to a cell selector input 24 of the QAM mapper 18. The data stream b is therefore employed to designate the least significant bits of each code word generated by the QAM mapper 18, which are the most sensitive to noise induced errors, and thus benefit the most from multiple level coding. The QAM mapper 18 combines the point and cell selector information to form a QAM output signal 26 for transmission through any suitable type of communication channel.

Figure 2:
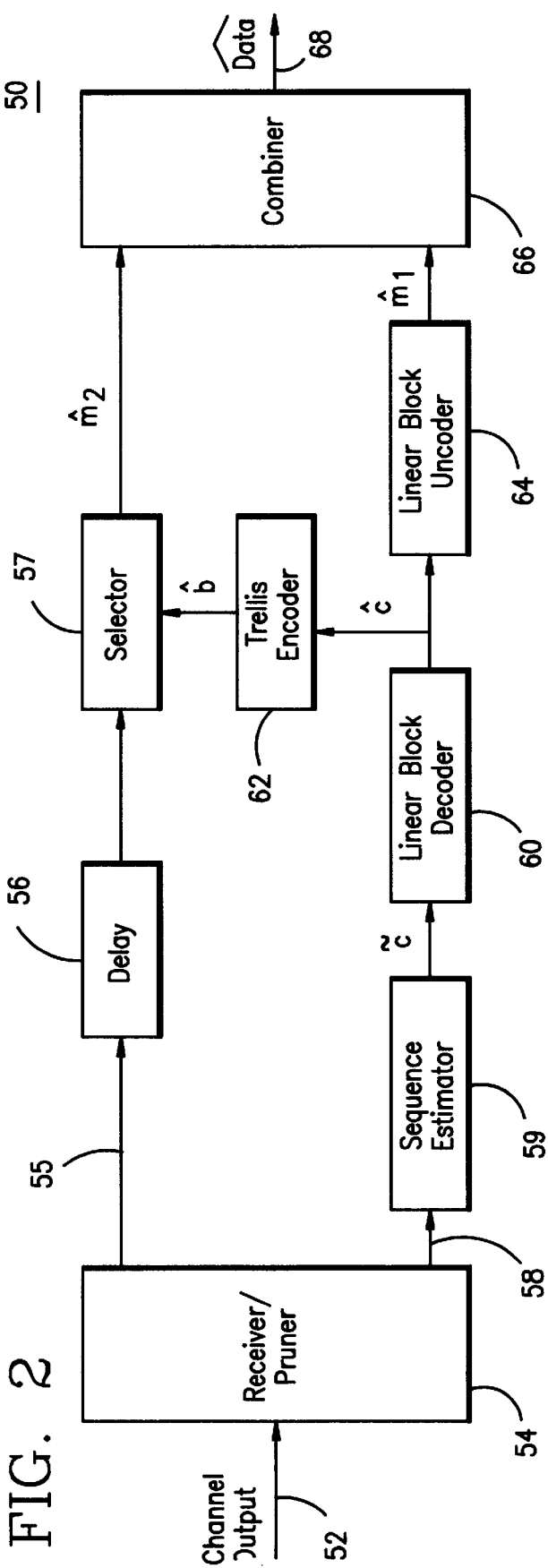
FIG. 2 is a schematic block diagram of a decoder circuit for use with the encoder circuit of FIG. 1.

FIG. 2 illustrates a decoder circuit 50 for decoding the QAM signals generated by the encoder 10 of FIG. 1. A channel output 52 feeds an incoming QAM signal to a receiver/pruner 54 which demodulates the signal, and performs an initial analysis to determine the content of the signal. The demodulated signal is comprised of a plurality of QAM symbols, each of which represents a point in the QAM constellation. The QAM constellation is defined by $2^n$ cells, where n equals the number of bits in each trellis encoded code word, and M labels for each point within each cell, where typically $M=2^P$, and p equals the number of bits in each unencoded data word or symbol in $m_2$. The receiver/pruner 54 identifies a point for each of the $2^n$ cells which represents the most likely point within each cell that is identified by the detected QAM symbol. This subset of all possible points is then passed through a line 55 first to a delay circuit 56, and then to a selector circuit 57 for further analysis as discussed below.

The receiver/pruner 54 also transmits the cell identification information through a line 58 to a sequence estimator 59. Using a conventional algorithm, such as Viterbi algorithm, the sequence estimator 59 determines the most likely one of the $2^n$ cells which was transmitted, and thereby reconstructs an estimation $\tilde{C}_1$ of the linear block encoded data stream $C_1$. $\tilde{C}_1$ is then fed to a linear block decoder 60 which detects and corrects errors in the detected encoded data stream $\tilde{C}_1$, thereby forming a corrected encoded data stream $\hat{C}_1$. In the best case scenario, $\hat{C}_1$ is identical to $C_1$ as generated by the linear block encoder 20 of FIG. 1.

$\hat{C}_1$ is fed both to a second trellis encoder 62, as well as to a linear block uncoder 64. The output $\hat{b}$ of the trellis encoder 62, is ideally the same as the output b of the first trellis encoder 22 in the encoder circuit 10. This is employed by the selector circuit 57 to determine which of the $2^n$ cells that the sequence estimator 59 has decided was identified by the QAM symbol. The delay circuit 56 is necessary to allow the sequence estimator 59, linear block decoder 60 and trellis encoder 62 time to make this determination. Using this information, the selector circuit 57 then decides which of the points in the subset generated by the receiver/pruner 54 is correct, thereby generating the detected non-trellis data stream $\hat{m}_2$. The detected trellis data stream, $\hat{m}_1$, is generated by the linear block uncoder 64 which converts $\hat{C}_1$ to $\hat{m}_1$, typically by striping the parity bits. Finally, $\hat{m}_1$ and $\hat{m}_2$ are combined in a combiner 66 to generate the detected output data stream 68.

The block structure of an encoder circuit 100 constructed in accordance with a second preferred embodiment of the invention is illustrated in FIG. 3. This is a more specific embodiment of the present invention which employs (extended) Reed-Solomon (RS) encoders, interleavers and FIFOs as discussed below. As in the first embodiment, the incoming data 101 is fed through a parser 102 which separates the data into a first 8 bit parallel data stream $m_1$ to be trellis encoded, and a second 8 bit parallel data stream $m_2$ which is not to be trellis encoded (the parallel edge information). The first data stream $m_1$ is fed through a first RS encoder 104 which is selected to have 8 bit error correcting capability (t=8), thus requiring 2t=16 parity bits, so that for every k=240 message bits, n=256 encoded bits are generated. A first interleaver 106 receives the RS encoded data, $C_1$, from the first RS encoder 104, and is provided to mitigate the effects of the burst errors due to the sequence estimation decoder for the TCM. The output ($C_1$) of the first interleaver 106 is fed through a 16:3 FIFO 107 which delivers 3 bits of data for every 16 bits of data fed from the interleaver 106 into a rate ¾ trellis encoder 108, such as a binary convolutional encoder (BCC). The 4 bit parallel output b of the trellis encoder 108 is fed to a cell selector input 109 of a conventional QAM mapper 110.

In contrast to the first embodiment, the "uncoded" parallel edge information bits of the trellis code, labelled $m_2$, are directed to a second RS encoder 112 to form an 8 bit parallel encoded data stream $C_2$. In this particular embodiment, the second RS encoder 112 is selected to have only a 2 bit error correcting capability (t=2), with k=252 and n=256 since the parallel edge information is not as error sensitive as the trellis encoded information. $C_2$ is fed through a second interleaver 114, and the interleaved data, ($C_2$), is fed through a 2:1 FIFO 115 to a point selector input 116 of the QAM mapper 110, which combines this data with the cell selector data to generate a QAM signal that is applied to a communication channel input 117.

To control each of the elements in the encoder circuit 100, a plurality of different clock rates is required. For example, the output of the 16:3 FIFO 107, trellis encoder 108 and output of the 2:1 FIFO 115 must all be clocked at the same period T, the symbol period for the QAM mapper 110. To properly clock the input to the 16:3 FIFO 107, a clock period of 16T/3 is employed to clock the output of the first RS encoder 104, the first interleaver 106 and the input to the 16:3 FIFO 107. Similarly, a clock period of 2T is required to clock the output of the second RS encoder 112, the second interleaver 114 and the input to the 2:1 FIFO 115. Finally, the input to the first RS encoder 104 must be clocked with a period of 256T/45, while the input of the second RS encoder 112 must be clocked with a period of 128T/63, to accommodate the somewhat slower input data rates to the two encoders 104 and 112.

A decoder circuit 150 to be employed with the encoder circuit 100 of FIG. 3 is illustrated in FIG. 4. The decoder circuit 150 operates in the same manner as the decoder cicuit 50 of FIG. 2, and includes many of the same elements. In particular, the QAM signal is fed through a channel output 152 to a receiver/pruner 154. The receiver/pruner 154 generates outputs to a delay/selector 156 for generating ($\tilde{C}_2$), and a sequence estimator 158 for generating ($\tilde{C}_1$). First and second deinterleavers 160 and 162 are provided for converting ($\tilde{C}_1$) and ($\tilde{C}_2$) into $\tilde{C}_1$ and $\tilde{C}_2$, respectively.

$\tilde{C}_1$ is converted to $\hat{C}_1$ by an RS decoder 164, and then $\hat{C}_1$ is converted to $\hat{m}_1$ by an RS uncoder 166. $\hat{C}_1$ is also employed to generate $\tilde{b}$, which is used by the delay/selector 156 to determine ($\tilde{C}_2$). Another interleaver 168 converts $\hat{C}_1$ to ($\hat{C}_1$), while a second trellis encoder 170 converts ($\hat{C}_1$) into $\hat{b}$. A second RS decoder 172 is employed to convert $\tilde{C}_2$ to $\hat{C}_2$, while a second RS uncoder 174 is employed to convert $\hat{C}_2$ to $\hat{m}_2$. Finally, $\hat{m}_1$ and $\hat{m}_2$ are combined in a combiner 176 to generate a detected output data stream 178. Although not illustrated in FIG. 4, it will be understood that a clocking scheme similar to that illustrated in FIG. 3 for the encoder circuit 100 is also required for the various elements of the decoder circuit 150.

In both of the foregoing embodiments of the present invention, it is important that the trellis encoders be feedback free to limit the propagation of errors in selecting parallel edge information due to the subsequent re-encoding of the more reliable estimate of $C_1$ which is obtained from the linear block or RS decoders. Otherwise, an error in the $C_1$ estimate could result in a large error in the estimate of b. Thus, using feedback free trellis encoders minimizes the corruption of the parallel edge information by the first decoding process, which allows for the use of either a weaker linear block or RS code for $m_2$ as in the second embodiment, or no code at all as in the first embodiment.

Figure 5:
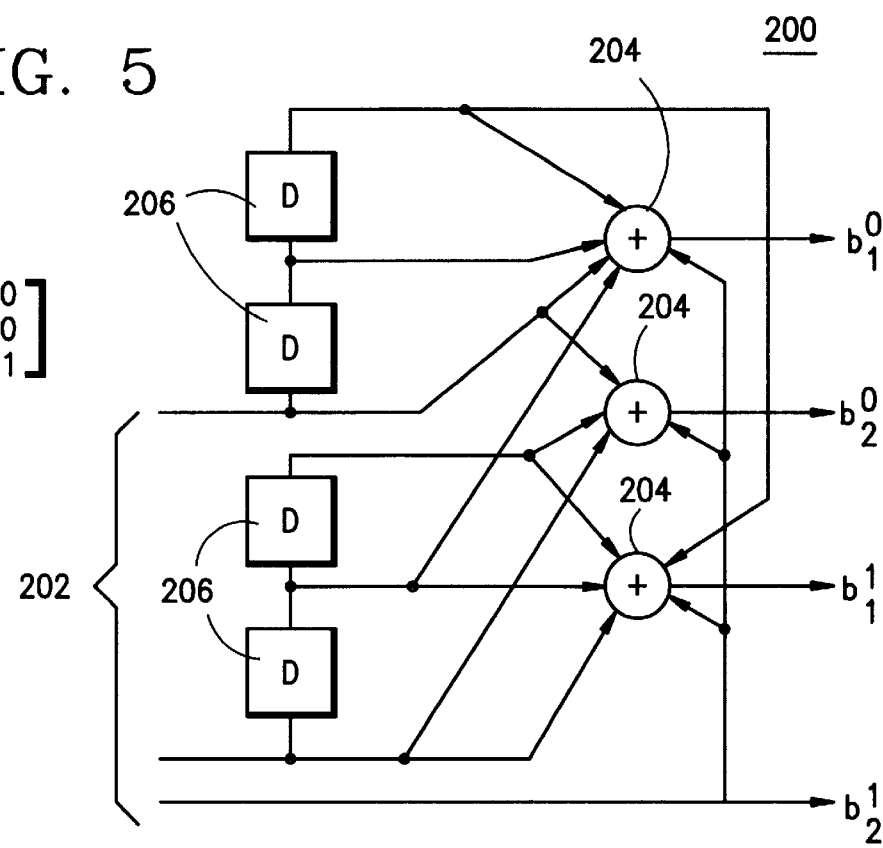
FIG. 5 is a schematic block diagram of a trellis encoder for use with the preferred embodiments of the present invention.

FIG. 5 illustrates an example of the feedback free trellis encoder 200 which may be employed in either embodiment of the present invention, although it is specifically designed for use with the second embodiment. The trellis encoder 200 is based on a design disclosed in the text book by Shu Lin and Daniel J. Costello, Jr., entitled "Error Control Coding: Fundamentals and Applications," Prentice-Hall, Engelwood Cliffs, N.J., 1983. The trellis encoder 200 receives bits from the 16:3 FIFO 107 on three input lines 202. These are converted to four cell selector outputs labelled $b_1^0$, $b_2^0$, $b_1^1$, and $b_2^1$. The bits on the input lines 202 are combined using a plurality of XOR function elements 204 and a plurality of shift register delay elements 206 to obtain the cell selector outputs. The transfer function embodied by the particular interconnection scheme for each of the inputs 202, XOR elements 204 and shift register delay elements 206 is represented in octal form by the transfer function matrix G illustrated in FIG. 5.

Figure 6:
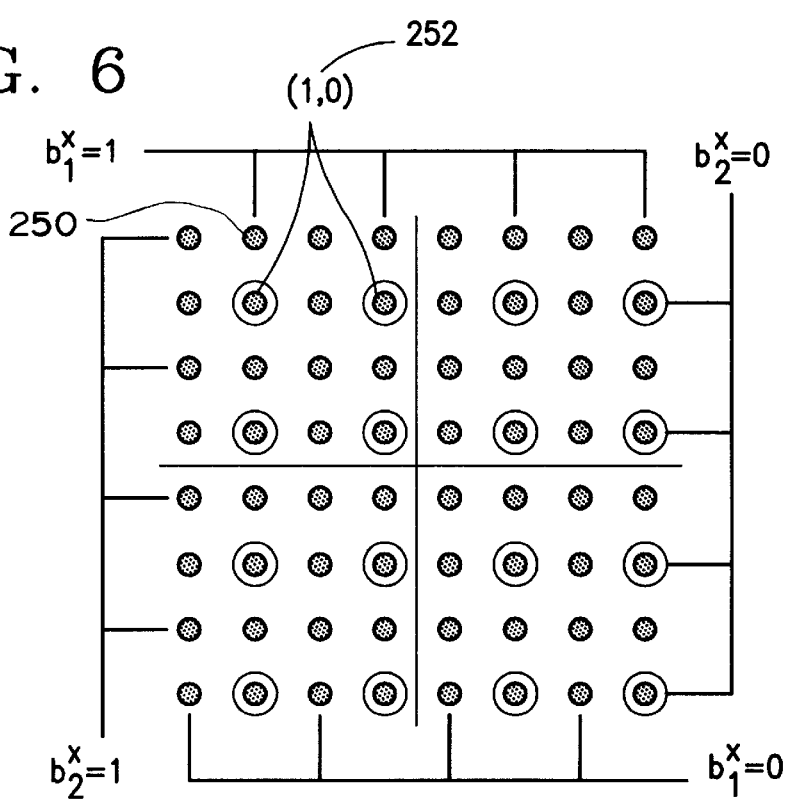
FIG. 6 is a diagram illustrating a two dimensional 64QAM constellation partitioned into four sets of 16 points for use with the trellis encoder of FIG. 5.

FIG. 6 illustrates a two dimensional 64QAM constellation which can be employed by the QAM mapper 110 with the trellis encoder 200 illustrated in FIG. 5. The constellation is comprised of 64 points 250 which are divided into four sets of 16 points, wherein each of these sets is a cell that is selected by one pair of b values from the trellis encoder 200. For example, the cell (1,0) is comprised of the circled plurality of points 252 in FIG. 6. A four bit label (not shown) is assigned to each point of each cell, and these labels are derived from the parallel edge information arriving from the 2:1 FIFO 115 on the point selector input 116 (see FIG. 3).

It should be noted that because the QAM constellation in FIG. 6 is two dimensional, and the trellis code generated by the trellis encoder is four dimensional, two QAM symbols are generated for each trellis symbol. Thus, the number of bits per trellis symbol is twice as many as the number of bits per QAM symbol. Returning to FIG. 3, the numbers adjacent the cell selector and point selector inputs 109 and 116, respectively, indicate the number of bits per QAM symbol and per trellis symbol, with the number of bits per trellis symbol being illustrated in parentheses.

One advantage of the second embodiment of the present invention is that the use of the two RS encoders 104 and 112 facilitates balancing or optimization of the system's overall coding gain. In particular, the relative coding strengths of each of the encoders 104 and 112 can be selected so that the best gain is achieved without unnecessary reductions in transmission rates. For example, much weaker coding of the parallel edge information $m_2$ can be employed in this embodiment. To illustrate, consider the selection of RS codes for an embodiment employing RS encoders and a 16 state, 4-D BCC based trellis code. The graphs in FIGS. 7A, 7B, 8A and 8B illustrate how the selection of the RS codes for the first and second RS encoders should be made. In each case, feedback free, 16 state, 4 dimensional BCC based trellis code with coding rate ¾ is used. This code uses the 16-way Ungerboeck partition in 4D. This code is similar to the Wei 16-state code used in the ITU V.34 standard, with the exception that the encoder is feedback free, is expressed as a rate ¾ code with a "1 bit parallel edge", and uses a different code generator G as in FIG. 5. The constellation in each case is 64QAM (as in the ITU J.83 standard). Both cases use a $t_1$=8 (extended) RS (n=256 over GF256) code for the first RS code. In the first case, which demonstrates the effect of unbalanced coding, a $t_2$=1 RS code is used for the second RS code. The second, balanced case uses a $t_2$=2 RS code for the second RS code. For each case, there are 6 curves shown on two measures of signal to noise ratio (SNR). The first measure is the channel SNR and the second is a normalized SNR relative to the Shannon capacity (which sits at 0 dB).

In all of the graphs, the top curve is the uncoded 64QAM curve. The curve with the circles shows the code performance with TCM only. The dashed curve, marked with (*), shows the error probability of the trellis information bits ($m_1$) with RS 1. The dotted curve, marked with "+", shows the error probability of ($m_2$) given the trellis information is decoded perfectly (b=$\hat{b}$) with RS 2. The unmarked solid curve shows the error probability for the entire system. The solid curve marked with "X" shows the effect of using a t=8

RS code for all of the information bits. (This is the same as using a $t_1=t_2=8$ RS code for each of the RS codes. It operates at a rate of R=5.5*15/16=5.156 bits per symbol.)

Figure 7A:
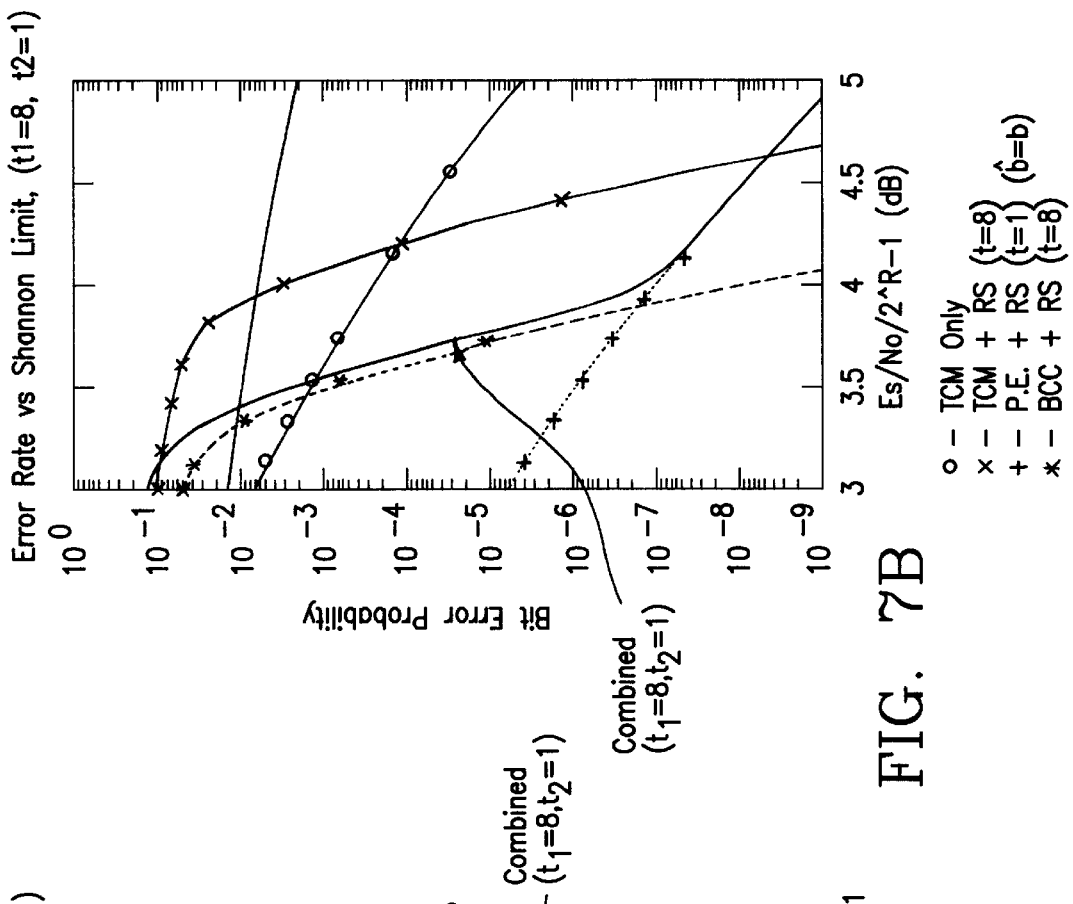
FIGS. 7A and 7B are graphs illustrating bit error probability versus Es/No and Shannon limit, respectively, for a 16 state, 4-D code with unbalanced RS coding.
Figure 7B:
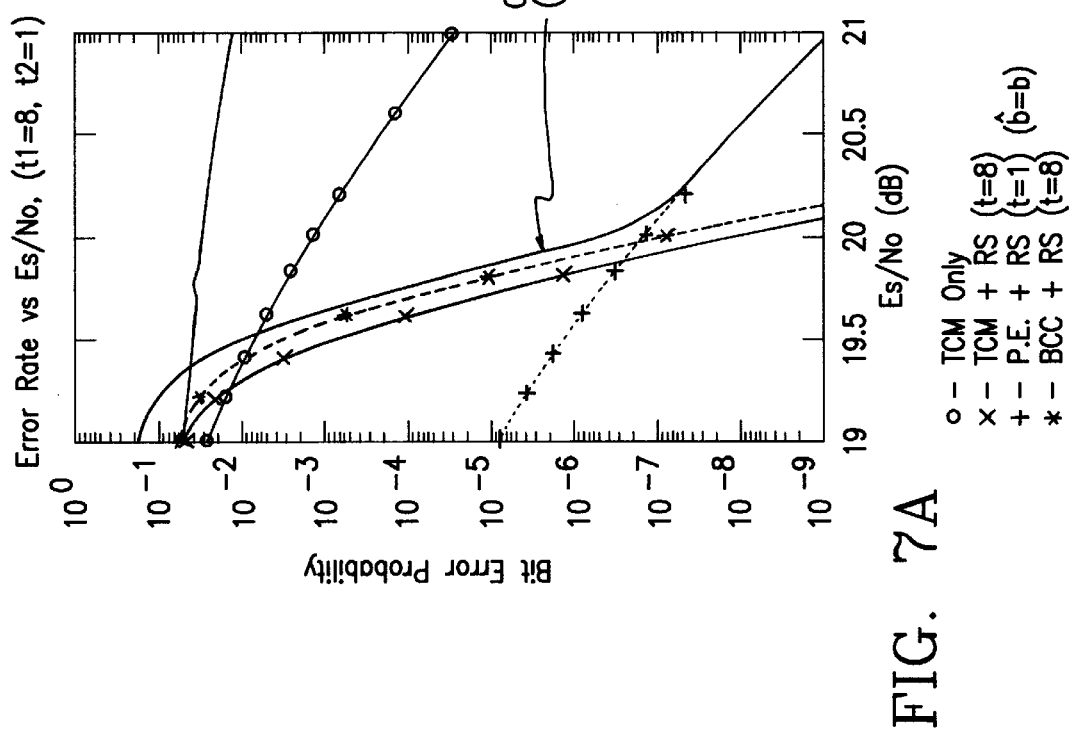

In the unbalanced case illustrated in FIGS. 7A and 7B, with respect to the Es/No scale, the performance of encoding all of the bits using a t=8 RS code appears to be the best (@$10^{-9}$) by about 0.1 dB relative to the trellis information, and by about 0.9 dB relative to the parallel edge information. This larger difference of 0.9 dB is due to the probability of error being dominated by the errors occurring in the parallel edge information, and is not due to incorrect decoding of the trellis information. As this system operates at a rate of R=1.5*15/16+4*127/128=5.375 bits per symbol, on the scale normalized by rate, it can be seen that the coding gain of the typical system (w.r.t. Shannon) is better by about 0.25 dB. This is attributed to the insufficiency of the $t_2=1$ RS code on the parallel edge information.

Figure 8A:
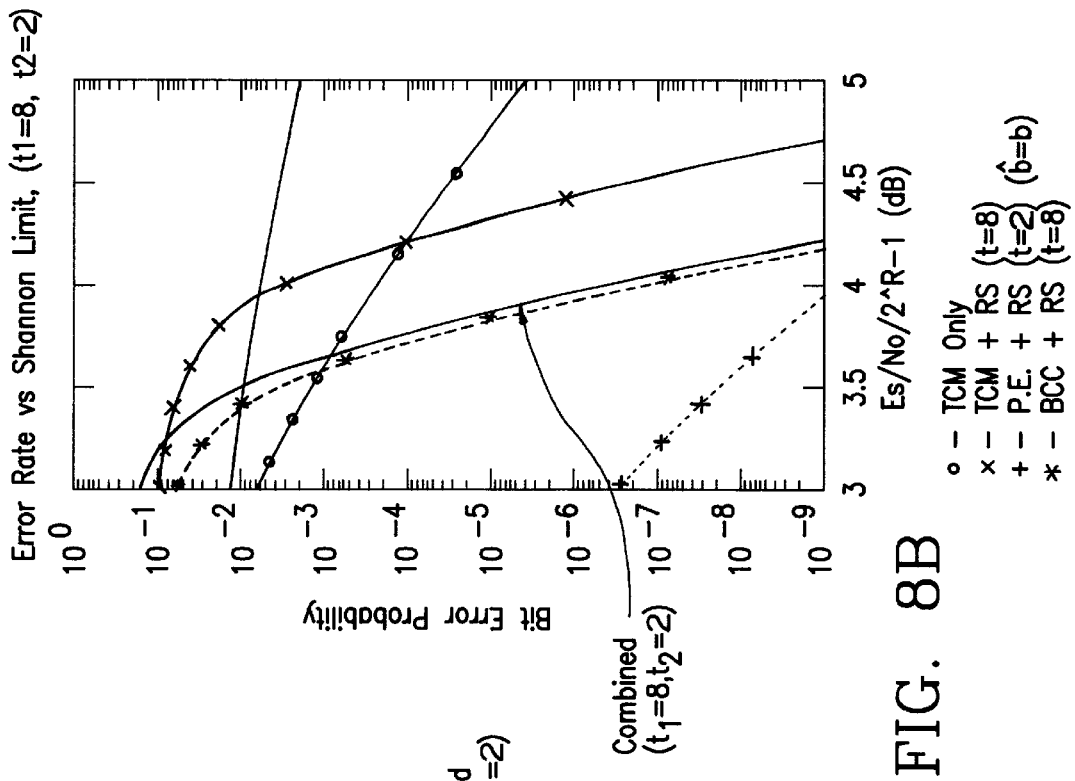
FIGS. 8A and 8B are graphs illustrating bit error probability versus Es/No and Shannon limit, respectively, for a 16 state, 4-D code which includes balanced RS encoding in accordance with the second preferred embodiment of the present invention.
Figure 8B:
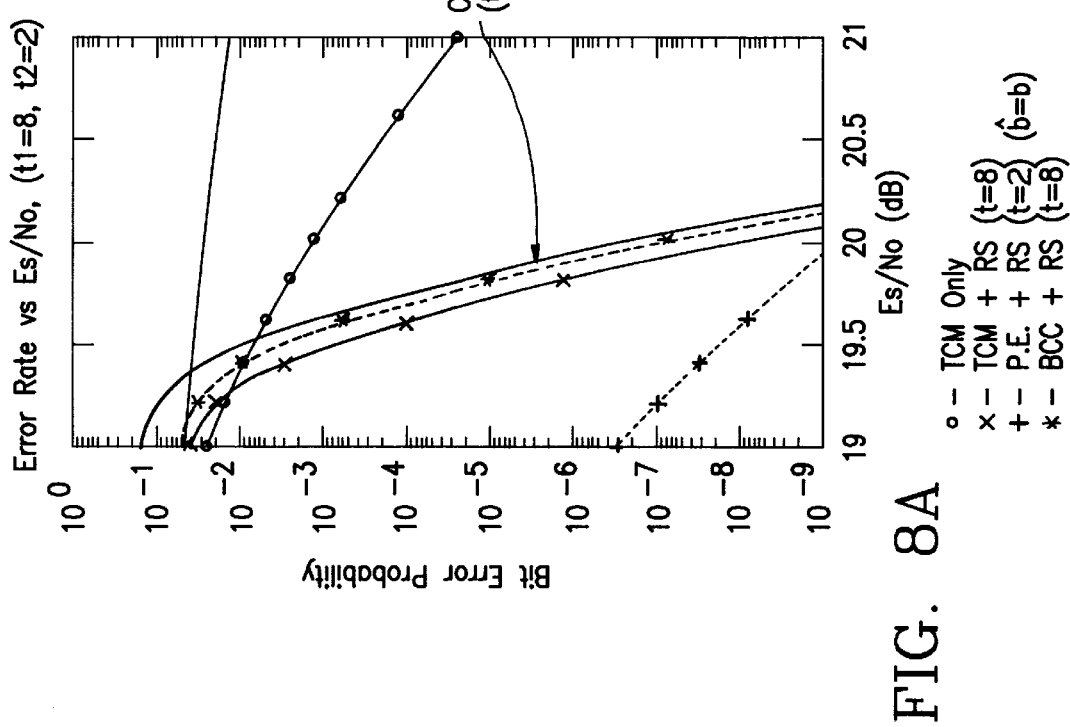

The second case illustrated in FIGS. 8A and 8B shows the improvement when balance is achieved. By increasing the error correction on the parallel edge information to $t_2=2$, the errors in decoding the parallel edge information are no longer dominated by the weakness of the RS code, and are primarily due to errors in decoding the trellis information. Thus, while the case using a single encoder appears to be better (@$10^{-9}$) on the Es/No scale by 0.15 dB, when the systems are normalized by their respective rates, the balanced concatenated scheme, which operates at a rate of R=1.5*15/16+4*63/64=5.34 bits per symbol, is over 0.5 dB better. It is also clear, from this analysis, that for a desired error rate of $10^{-9}$, increasing the error correction capability of the second RS code beyond $t_2=2$ would be a waste of redundancy, since no apparent improvement in reliability would be achieved at a cost of loss in data rate.

It should be noted that although the invention has been disclosed as being implementing with discrete functional elements, including encoders, interleavers, mappers, etc., these elements need not be discrete components, and the functions of them can be carried out with an appropriately programmed digital signal processor(s) or the like.

Although the present invention has been disclosed in terms of a number of preferred embodiments and variations thereof, it will be understood that numerous additional variations and modifications could be made thereto without departing from the scope of the invention as defined by the following claims.

What is claimed is:

1. A method for decoding a received transmitted digital signal which has been both trellis and linear block encoded, said method comprising the steps of:
    a) generating an estimation of a linear block encoded data stream from said received signal;
    b) uncoding said estimation of said linear block encoded data stream to form a detected version of a first uncoded data stream;
    c) trellis encoding said estimation of said linear block encoded data stream to form an estimation of a concatenated trellis and linear block encoded data stream;
    d) generating a detected version of a second encoded data stream from said received digital signal and said estimation of a concatenated trellis and linear block encoded data stream; and
    e) combining said detected versions of said first and second uncoded data streams to form a detected output data stream.

2. The method of claim 1, wherein said step of generating an estimation of said first linear block encoded data stream is carried out using a Viterbi algorithm.

3. The method of claim 1, wherein said step of uncoding said estimation further comprises uncoding said estimation with a Reed-Solomon uncoder.

4. The method of claim 1, wherein the step of trellis encoding said estimation further comprises encoding said estimation with a binary convolutional code.

5. The method of claim 1, wherein said trellis encoding is performed in a feedback free manner.

6. The method of claim 1, further comprising the steps of:
    1) de-interleaving said estimation of said linear block encoded data stream before uncoding and trellis encoding said estimation; and
    2) re-interleaving said estimation before trellis encoding said estimation.

7. The method of claim 1, wherein said received transmitted digital signal comprises a plurality of QAM symbols, each of said symbols including point and cell selector information generated by a QAM mapper for a corresponding code word, and said step of generating an estimation of a linear block encoded data stream from said received transmitted signal further comprises using the cell selector information and an algorithm to determine the most likely identity of each cell in each QAM symbol of said received digital signal.

8. The method of claim 7, wherein said step of employing said received digital signal and said estimation of said concatenated trellis and linear block encoded data stream to generate a detected version of a second uncoded data stream further comprises:
    1) generating a subset of points for each QAM symbol in said received digital signal, said subset containing for each possible QAM cell, a corresponding point which represents the most likely point within each cell that is identified by each received QAM symbol; and
    2) employing said estimation of said concatenated trellis and linear block encoded data stream to decide, for each QAM symbol in said received digital signal, which of said points in said subset was transmitted to thereby generate a detected version of said second uncoded data stream.

9. An apparatus for decoding a received transmitted digital signal which has been both trellis and linear block encoded, said apparatus comprising:
    a) a sequence estimator for generating an estimation of a transmitted linear block encoded data stream from said received digital signal;
    b) an uncoder for uncoding said estimation of said linear block encoded data stream to form a detected version of a first uncoded data stream;
    c) a trellis encoder for trellis encoding said estimation of said linear block encoded data stream to form an estimation of a concatenated trellis and linear block encoded data stream;
    d) means responsive to said received digital signal and said estimation of said concatenated trellis and linear block encoded data stream for generating a detected version of a second uncoded data stream; and
    e) a combiner for combining said detected versions of said first and second uncoded data streams to form a detected output data stream.

10. The apparatus of claim 9, wherein said sequence estimator employs a Viterbi algorithm to generate said estimation of said linear block encoded data stream.

11. The apparatus of claim 10, wherein said trellis encoder comprises a binary convolutional encoder.

12. The apparatus of claim 9, wherein said trellis encoder is feedback free.

13. The apparatus of claim 9, further including a linear block decoder for detecting and correcting errors in said estimation of said linear block encoded data stream before the estimation is fed to said uncoder and said trellis encoder.

14. The apparatus of claim 9, wherein said received transmitted digital signal comprises a plurality of QAM symbols, each of said symbols including point and cell selector information generated by a QAM mapper for a corresponding code word, and said apparatus further comprises:

means for transmitting said cell information to said sequence estimator, said sequence estimator employing the cell selector information and an algorithm to determine the most likely identity of each cell in each QAM symbol of said received digital signal, and thereby generating said estimation of said transmitted linear block encoded data stream from said received digital signal.

15. The apparatus of claim 14, wherein said sequence estimator employs a Viterbi algorithm to generate said estimation of said linear block encoded data stream.

16. The apparatus of claim 14, wherein said means responsive to said received digital signal and said estimation of said concatenated trellis and linear block encoded data stream for generating said detected version of said second uncoded data stream further comprises:

1) means for generating a subset of points for each QAM symbol in said received digital signal, said subset containing for each possible QAM cell, a corresponding point which represents the most likely point within each cell that is identified by each received QAM symbol; and 2) a selector employing said estimation of said concatenated trellis and linear block encoded data stream for selecting, for each QAM symbol in said received digital signal, which of said points in said subset was transmitted to thereby generate said detected version of said second uncoded data stream.

17. The apparatus of claim 16, further comprising a delay means between said means for generating and said selector for delaying selection of said point for a corresponding QAM symbol in said received digital signal until said trellis encoder has encoded a code word corresponding to said QAM symbol.

18. The apparatus of claim 9, wherein said uncoder is a Reed-Solomon uncoder.

19. The apparatus of claim 9, further comprising:

1) a de-interleaver for de-interleaving said estimation of said linear block encoded data stream; and 2) an interleaver for re-interleaving said de-interleaved estimation of said first linear block encoded data stream before feeding said estimation to said trellis encoder.

* * * * *